US008485127B2

(12) United States Patent
Nishimoto et al.

(10) Patent No.: US 8,485,127 B2
(45) Date of Patent: Jul. 16, 2013

(54) PROCESSING APPARATUS

(75) Inventors: Shinya Nishimoto, Amagasaki (JP);
 Tamaki Yuasa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 942 days.

(21) Appl. No.: 12/090,493

(22) PCT Filed: Oct. 18, 2006

(86) PCT No.: PCT/JP2006/320737
§ 371 (c)(1),
(2), (4) Date: Apr. 17, 2008

(87) PCT Pub. No.: WO2007/046414
PCT Pub. Date: Apr. 26, 2007

(65) Prior Publication Data
US 2009/0133835 A1 May 28, 2009

(30) Foreign Application Priority Data

Oct. 18, 2005 (JP) .................................. 2005-302592
Jun. 21, 2006 (JP) .................................. 2006-171484

(51) Int. Cl.
*C23C 16/00* (2006.01)
*C23F 1/00* (2006.01)
*H01L 21/306* (2006.01)

(52) U.S. Cl.
USPC ................. 118/723 MW; 118/733; 118/724; 118/715; 156/345.41; 156/345.37

(58) Field of Classification Search
USPC ................. 118/723 MW, 715, 719, 724, 733; 156/345.42, 345.27, 345.29, 345.37
See application file for complete search history.

(56) References Cited

U.S. PATENT DOCUMENTS

| 5,062,386 | A | * | 11/1991 | Christensen | 118/725 |
| 5,134,965 | A | * | 8/1992 | Tokuda et al. | 118/723 MW |
| 5,368,648 | A | * | 11/1994 | Sekizuka | 118/733 |
| 5,961,850 | A | * | 10/1999 | Satou et al. | 216/67 |
| 6,092,486 | A | * | 7/2000 | Mabuchi et al. | 118/723 MW |
| 6,176,198 | B1 | * | 1/2001 | Kao et al. | 118/723 ME |
| 7,527,706 | B2 | * | 5/2009 | Morita | 156/345.41 |
| 2004/0112292 | A1 | * | 6/2004 | Ishii | 118/723 MW |
| 2004/0250771 | A1 | * | 12/2004 | Ozaki et al. | 118/723 MW |
| 2005/0160979 | A1 | * | 7/2005 | Grin et al. | 118/666 |
| 2006/0213438 | A1 | * | 9/2006 | Ishizaka et al. | 118/715 |

FOREIGN PATENT DOCUMENTS

| JP | 4 88162 | | 3/1992 |
| JP | 6 168899 | | 6/1994 |
| JP | 2003 133409 | | 5/2003 |
| JP | 2004 172397 | | 6/2004 |
| JP | 2004 214283 | | 7/2004 |
| WO | WO 03036708 | * | 5/2003 |
| WO | WO 2004034455 | * | 4/2004 |

* cited by examiner

*Primary Examiner* — Rakesh Dhingra
(74) *Attorney, Agent, or Firm* — Rothwell, Figg, Ernst & Manbeck, P.C.

(57) ABSTRACT

A structure of an improved processing vessel for a processing apparatus, which processes a target object using a processing gas, is disclosed. The target object, such as a semiconductor wafer, is heated within a metal cylindrical shaped processing vessel. The processing vessel includes a plurality of block bodies mutually connected by being stacked in the vertical direction. Heat insulating vacuum layers are arranged between the adjacent block bodies. Thus, heat transfer between block bodies is suppressed, so that temperature of each block body can be separately controlled, thereby improving energy efficiency.

20 Claims, 10 Drawing Sheets

PROCESSING APPARATUS

FIELD OF THE INVENTION

The present invention relates to a processing apparatus for use in performing a specified processing on a target object such as a semiconductor wafer or the like.

BACKGROUND OF THE INVENTION

In general, for the manufacture of semiconductor products such as an integrated circuit and the like, various processings including a film forming processing, an oxidation diffusion processing, an etching processing, a quality modification processing and an annealing processing are repeatedly carried out to a semiconductor wafer such as a silicon substrate or the like. A plasma processing apparatus is often used in performing processings of film forming, etching and ashing (see, e.g., JP2003-257933A). In recent years, there is a tendency to frequently use a microwave plasma processing apparatus, owing to an advantage that the apparatus is capable of stably generating high density plasma even in a high vacuum state of about 0.1 mTorr (13.3 mPa) to several tens of mTorr (several Pa). Such a plasma processing apparatus is disclosed in JP3-191073A, JP5-343334A, JP9-181052A, etc.

FIG. 11 is a cross sectional view schematically illustrating a structure of a conventional microwave plasma processing apparatus. In this microwave plasma processing apparatus 2, a mounting table 6 for supporting a semiconductor wafer W is provided within an evacuable processing vessel 4. A disc-shaped ceiling plate 8 made of microwave-transmitting aluminum nitride or quartz is air-tightly mounted to a ceiling portion of the processing vessel 4 that faces the mounting table 6. On a sidewall of the processing vessel 4, there is provided a gas nozzle 9 for introducing a processing gas into the vessel.

Installed above the ceiling plate 8 are a disc-shaped planar antenna member 10 having a thickness of about several millimeters and a wave retardation plate 12 made of a dielectric material and adapted to shorten the wavelength of a microwave in a radial direction of the planar antenna member 10. A multiple number of slot-shaped microwave radiation holes 14 are formed in the planar antenna member 10. A core conductor 18 of a coaxial waveguide 16 is connected to a center portion of the planar antenna member 10. A microwave of 2.45 GHz generated in a microwave generator 20 is converted to a specified vibration mode in a mode converter 22 and then guided to the planar antenna member 10. The microwave propagates radially through the antenna member 10 and is irradiated through the microwave radiation holes 14. Then, the microwave is introduced into the processing vessel 4 by penetrating the ceiling plate 8. Plasma originating from a processing gas is generated in a processing space A of the processing vessel 4 by the energy of the microwave. Using the plasma, a specified plasma processing such as etching or film forming is performed on a semiconductor wafer W.

In order to prevent an unnecessary film from adhering to an inner sidewall surface of the processing vessel when film forming is performed by plasma CVD (Chemical Vapor Deposition), or in order for an unnecessary film otherwise adhering thereto to be easily removed by dry cleaning, it is often necessary to keep the inner sidewall surface of the processing vessel at a considerably high temperature during the film-forming process. For example, if the temperature of the inner sidewall surface of the processing vessel remains low when a fluorocarbon film (interlayer dielectric film) of a low dielectric constant is formed on a wafer by plasma CVD using a CF-based gas, it is highly likely that an unnecessary film is deposited on the inner sidewall surface of the processing vessel. Furthermore, the unnecessary film adhering thereto at a low temperature is difficult to dislodge by dry cleaning.

With a view to solve this problem, a heater built-in type inner wall 24 having a thickness of 4 to 9 mm is provided along the inner sidewall surface at a position inwardly spaced apart several millimeters from the inner sidewall surface of the processing vessel 4. When forming a film, it is possible to prevent an unnecessary film from depositing on an inner surface of the inner wall by heating the inner wall 24 up to a temperature of about 100 to 200° C. In the meantime, a coolant passage 26 for allowing coolant to flow therethrough is provided in a sidewall of the processing vessel 4. By circulating the coolant through the coolant passage 26, the processing vessel 4 is kept at a safe temperature of about 90° C.

However, the solution noted above suffers from the following problems. First, since the space existing radially outwardly of the wafer W becomes narrow due to the presence of the inner wall 24, a gas stream flowing around the wafer W is changed and so is the radiant heat impinging on the wafer W. This may possibly reduce the in-plane uniformity of a film thickness. Furthermore, even though the inner wall 24 is heated up, it is unavoidable that an unnecessary film is deposited on the inner wall 24 in the course of processing a large number of wafers. If the distance between the wafer W and the inner wall 24 is small as noted above, there is also a possibility that the reproducibility of a film thickness becomes worse due to the change in a surface state of the inner wall, which would be caused by deposition of the unnecessary film. Although the above problems could be solved by increasing the size of the processing vessel 4 in proportion to the installation space of the inner wall 24, this is undesirable in that an increase in the size of the processing vessel 4 leads to an increase in the footprint of a processing apparatus.

Moreover, if a cooling operation of the sidewall of the processing vessel 4 is performed simultaneously with a heating operation of the inner wall 24 arranged adjacent to the processing vessel 4, the heating effect is set off against the cooling effect, thereby posing a problem in that energy efficiency becomes low by the unnecessary consumption of energy. An additional problem of the structure shown in FIG. 11 is its inability to perform temperature control to intentionally generate a temperature variation in a vertical direction of the processing vessel and, particularly, its inability to locally cool a specified portion.

SUMMARY OF THE INVENTION

In view of the problems noted above, it is an object of the present invention to enable temperatures of various portions of a processing vessel to be controlled independently of one another, while improving energy efficiency involved in heating and/or cooling the processing vessel.

In accordance with one aspect of the present invention, there is provided a processing apparatus for performing a specified processing on a target object, including: an evacuable processing vessel made of metal; a mounting table provided within the processing vessel for mounting the target object thereon; a heating unit for heating the target object; and a gas introduction unit for introducing a processing gas into the processing vessel, wherein the processing vessel comprises a plurality of interconnected block bodies and an inter-block heat insulating vacuum layer is provided between the adjoining block bodies.

This makes it possible to independently and efficiently control the temperature of the respective block bodies, thanks to the fact that the heat insulating vacuum layer provided between the block bodies suppresses heat transfer between the block bodies.

Preferably, the adjoining block bodies are arranged to adjoin to each other in a vertical direction, wherein the inter-block heat insulating vacuum layer is defined by the adjoining block bodies in the vertical direction and seal members for hermetically sealing inner and outer peripheral side of an inter-block gap provided between the block bodies, and wherein the processing apparatus further comprises a vacuum exhaust system for vacuum exhausting the inter-block gap to ensure that the inter-block gap serves as the inter-block heat insulating vacuum layer.

Preferably, the adjoining block bodies do not make direct contact with each other. Preferably, a non-metallic spacer member for forming the inter-block gap between the adjoining block bodies is provided between the adjoining block bodies.

Preferably, at least one of the block bodies has an outer circumferential surface covered with a protective cover member and wherein an outer heat insulating vacuum layer is provided between the outer circumferential surface and the protective cover member. Preferably, the outer heat insulating vacuum layer is defined by said at least one of the block bodies, the protective cover member and seal members for hermetically sealing end portions of an outer gap provided between said at least one of the block bodies and the protective cover member, and wherein the processing apparatus further comprises a vacuum exhaust system for vacuum exhausting the outer gap to ensure that the outer gap serves as the outer heat insulating vacuum layer. Preferably, the inter-block gap and the outer gap communicate with each other through a communication path and are commonly vacuum exhausted by the vacuum exhaust system.

Preferably, at least one of the block bodies is provided with a block body heating unit or is provided with a block body cooling unit. Preferably, each of the block bodies is provided with a block body heating unit for heating the corresponding block body or a block body cooling unit for cooling the corresponding block body, wherein each of the block bodies is provided with a temperature measuring unit for detecting a temperature of the corresponding block body, and wherein the block body heating unit or the block body cooling unit provided in each of the block bodies is connected to a temperature control unit and, based on the temperature of each of the block bodies measured by the temperature measuring unit, the temperature control unit controls the block body heating unit or the block body cooling unit provided in each of the block bodies so that the temperature of each of the block bodies can become a target value. Preferably, the block bodies are controlled to have different temperatures.

Preferably, the processing apparatus further including a plasma generating unit for forming electric fields, magnetic fields or electromagnetic fields in the processing vessel to generate plasma within the processing vessel or a plasma introduction unit for supplying plasma generated outside the processing vessel into the processing vessel, and wherein a plasma infiltration prevention ring member for preventing the plasma in the processing vessel from infiltrating into the inter-block gap is provided on an inner side of the seal member lying on the inner peripheral side of the inter-block gap. Preferably, the processing apparatus includes the plasma generating unit, the plasma generating unit including a unit for supplying microwaves or high frequency waves into the processing vessel, and wherein a shield member for electrically connecting the adjoining block bodies to prevent the microwaves or the high frequency waves from leaking to the outside of the processing vessel is provided in the inter-block gap.

Preferably, the processing apparatus comprises the plasma generating unit, the plasma generating unit including a unit for supplying microwaves into the processing vessel, wherein a microwave transmitting ceiling plate is provided in a ceiling portion of the processing vessel, and wherein a planar antenna member for introducing the microwaves into the processing vessel is provided in the ceiling plate.

Preferably, the block bodies including: an upper block body for supporting the ceiling plate; a middle block body for supporting a gas injection portion that injects the processing gas into the processing vessel, the gas injection portion serving as a part of the gas introduction unit; and a lower block body corresponding in position to the mounting table.

Preferably, the middle block body comprises a plurality of vertically layered pieces, and wherein one of the pieces other than a lowermost piece is adapted to support the gas injection portion. Preferably, the plurality of pieces is layered to ensure that the vertically adjoining pieces make direct contact with each other, wherein the upper block body and the piece for supporting the gas injection portion are kept combined together, wherein the piece for supporting the gas injection portion is separable from the piece below it, and wherein the processing apparatus comprises an unfolding unit for allowing the upper block body and the piece for supporting the gas injection portion to be unfolded as a unit. Preferably, the middle block body comprises three pieces, wherein a gas ring structure for supplying a cleaning gas is provided in a top one of the three pieces, wherein the gas injection portion is supported on a middle one of the three pieces, wherein the upper block body is integrally combined with the top and middle pieces, wherein a bottom one of the three pieces is separable from the middle piece, and wherein the processing apparatus comprises an unfolding unit for allowing the upper block body and the top and middle pieces to be unfolded as a unit, and the upper block body and the top and middle pieces combined together are separated from the bottom piece by operating the unfolding unit.

DETAILED DESCRIPTION OF THE EMBODIMENTS

Hereinafter, an embodiment of a processing apparatus in accordance with the present invention will be described in detail with reference to the accompanying drawings. It is to be noted that, in the accompanying drawings, the sidewall portion of a processing vessel is exaggeratedly illustrated for the sake of easier understanding. In the present embodiment, the processing apparatus is formed of a microwave plasma processing apparatus 32.

Figure 1:
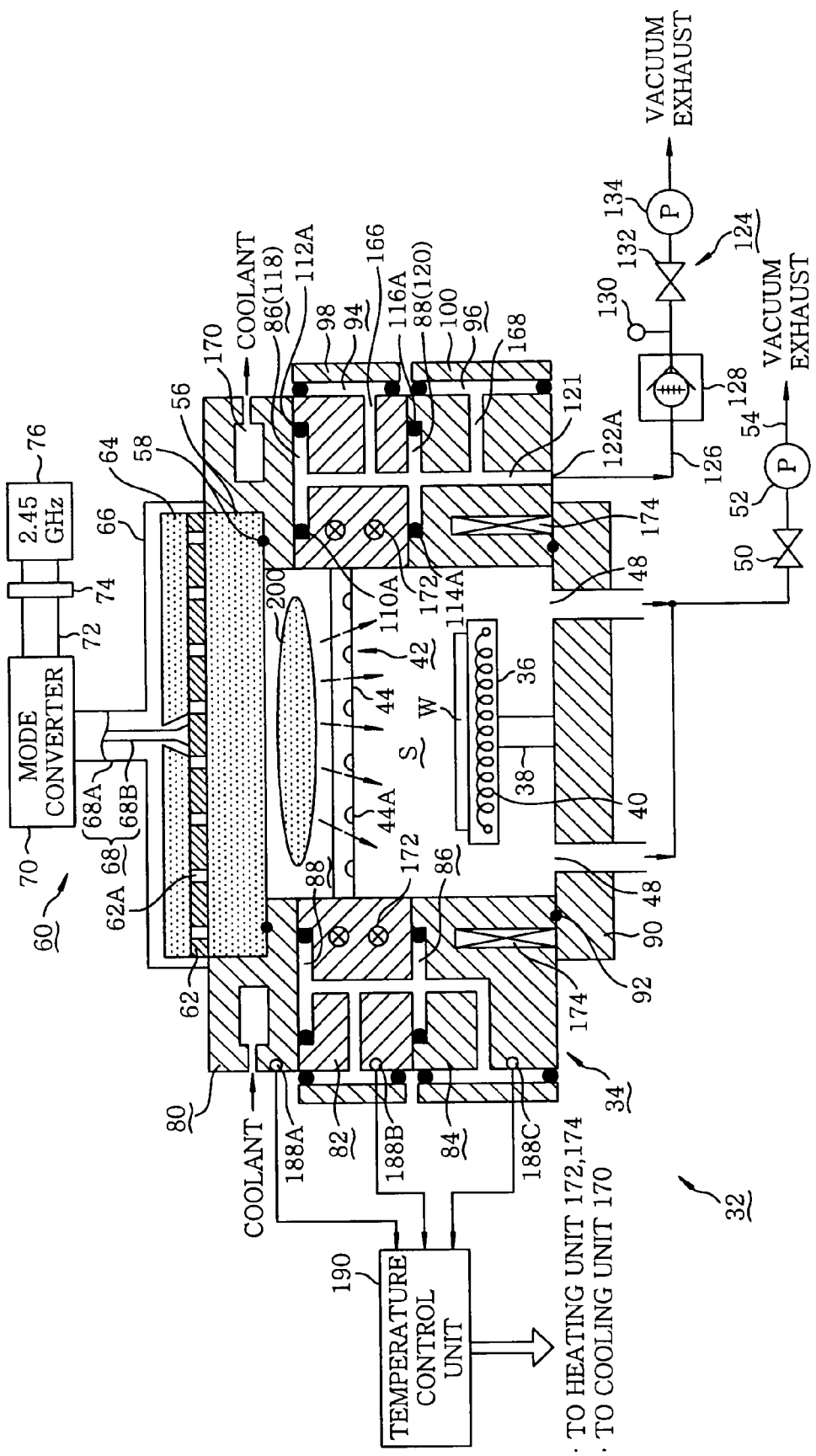
FIG. 1 is a cross sectional view showing an embodiment of a processing apparatus in accordance with the present invention.

As shown in FIG. 1, the plasma processing apparatus 32 includes a processing vessel 34 formed into a cylindrical shape as a whole. A hermetically sealed processing space S is defined within the processing vessel 34. The processing vessel 34 has a sidewall and a bottom wall, each of which is made of metal such as aluminum or the like. The processing vessel 34 remains electrically grounded.

Received within the processing vessel 34 is a disc-shaped mounting table 36 on which a target object, e.g., a semiconductor wafer W, is held thereon. The mounting table 36 may be made of aluminum which has been subjected to an alumite treatment. The mounting table 36 is supported by a support 38 extending upright from the bottom wall of the processing vessel 34, the support 38 being made of an insulating material. Embedded in the mounting table 36 is a suitable heater, e.g., a resistance heater 40, for heating a wafer W mounted on the mounting table 36. On a top portion of the mounting table 36, there is provided an electrostatic chuck or a clamp mechanism (not shown) for holding the wafer W in place. Furthermore, the mounting table 36 may be often connected to a high frequency power supply for biasing a specified frequency, e.g., a frequency of 13.56 MHz.

Provided above the mounting table 36 is a gas injection portion 42 in the form of a shower head 44 for injecting a required gas into the processing vessel 34. In the illustrated embodiment, the shower head 44 includes a plurality of quartz pipes arranged in a lattice pattern when seen from the top thereof, the quartz pipes being arranged at a pitch of about 5 cm. The shower head 44 is attached to and supported by the sidewall of the processing vessel 34. Through a multiple number of gas injection holes 44A formed in a lower surface thereof, the shower head 44 is capable of injecting a processing gas such as a film forming gas or the like into the processing space S at a controlled flow rate. The structure of the shower head 44 is not limited to that described above.

Figure 2:
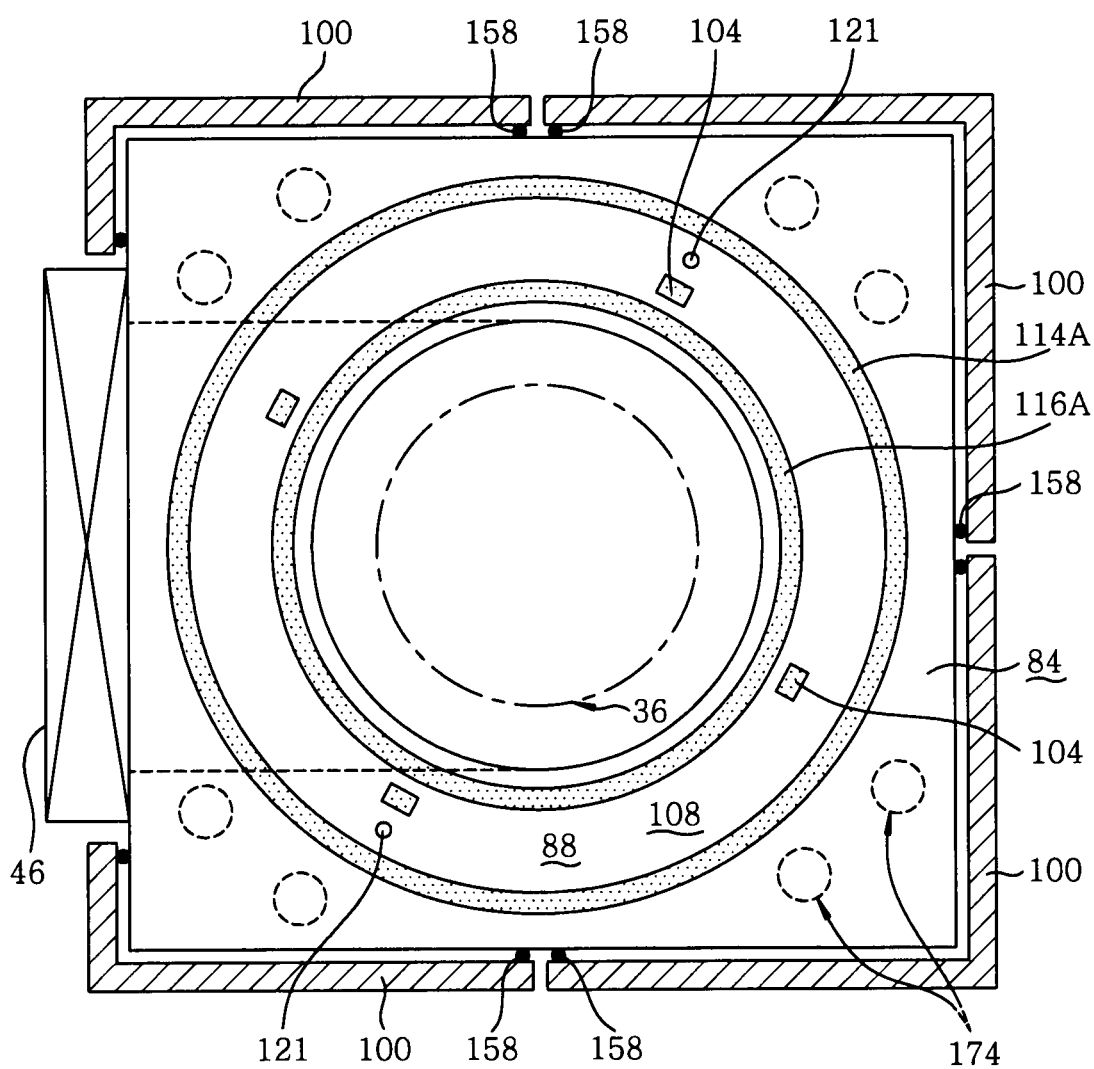
FIG. 2 is a plan view illustrating a lower block body of a processing vessel.

As illustrated in FIG. 2, on the sidewall of the processing vessel 34, there is provided a gate valve 46 that will be opened when loading and unloading a wafer into and out of the processing vessel 34. A gas exhaust port 48 is formed in the bottom wall of the processing vessel 34. A gas exhaust line 54 is connected to the gas exhaust port 48, and a pressure regulator valve 50 and a vacuum pump 52 are provided on the gas exhaust line 54. This makes it possible to vacuum-evacuate the processing vessel 34 down to a desired pressure, when necessary. The processing vessel 34 has an opening on a ceiling portion thereof, which opening is air-tightly closed off through a seal member 58 such as an O-ring or the like by means of a microwave-penetrating ceiling plate 56 made of quartz or a ceramics material such as alumina or the like. Taking a pressure resistance into account, the ceiling plate 56 is designed to have a thickness of about 20 mm.

The plasma processing apparatus 32 includes a plasma generating unit for generating plasma in the processing vessel 34. In the illustrated embodiment, the plasma generating unit includes a microwave supply unit 60 for supplying microwaves into the processing vessel 34. The microwave supply unit 60 includes a planar antenna member 62 provided on an upper surface of the ceiling plate 56. On the planar antenna member 62, there is provided a wave retardation plate 64 made of a high permittivity material, e.g., aluminum nitride. The wave retardation plate 64 serves to shorten the in-tube wavelength of microwaves by virtue of its wavelength-shortening effect. The planar antenna member 62 is formed of a bottom plate of a wave guide box 66 that is an electrically-conductive hollow cylindrical container covering the entire top region of the wave retardation plate 64. The planar antenna member 62 is disposed to face the mounting table 36 within the processing vessel 34.

Peripheral portions of the wave guide box 66 and the planar antenna member 62 are all electrically grounded. An outer conductor 68A of a coaxial waveguide 68 is connected to the upper center portion of the wave guide box 66. A core conductor 68B arranged inside the outer conductor 68A extends through a center through-hole of the wave retardation plate 64 to be connected to the center portion of the planar antenna member 62. The coaxial waveguide 68 is connected via a mode converter 70, a waveguide 72 and a matching unit 74 to a microwave generator 76 that generates microwaves of a specified frequency, e.g., 2.45 GHz. The frequency of microwaves is not limited to 2.45 GHz but may be other values, e.g., 8.35 GHz. A waveguide having a circular or rectangular cross section or a coaxial waveguide can be used as the waveguide.

The planar antenna member 62 may have a diameter of 300 to 400 mm in the event that the target object is a wafer of 8 inches in size. In the illustrated embodiment, the planar antenna member 62 is made of a conductive material, e.g., a silver-plated copper plate or aluminum plate, of one to several millimeters in thickness. A multiple number of microwave radiation holes 62A that are elongated through-holes or slots are formed in the planar antenna member 62. The microwave radiation holes 62A may be arranged in a concentric, spiral or radial pattern or may be evenly distributed over the entire surface of the antenna member 62.

Figure 3:
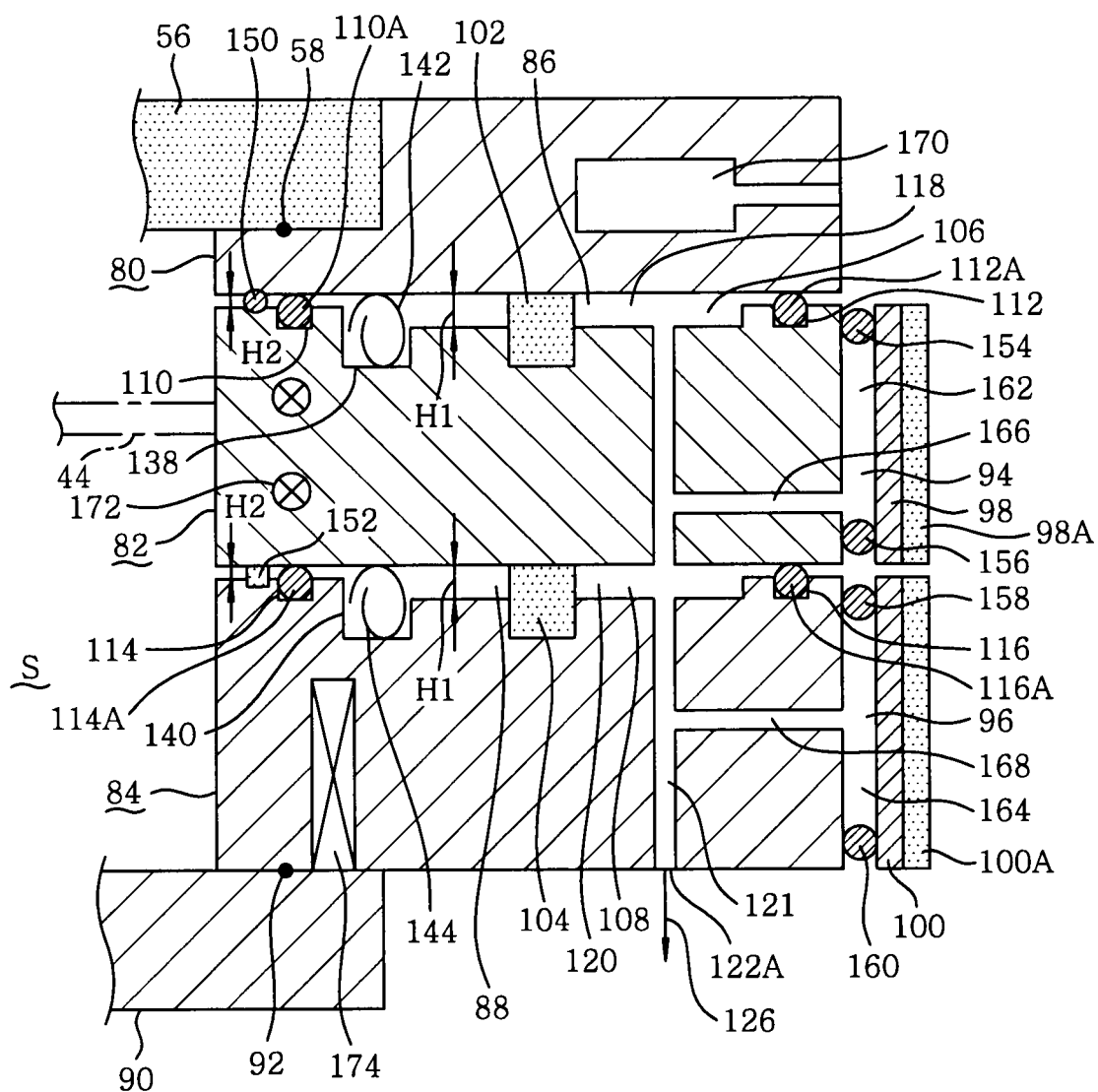
FIG. 3 is a partially enlarged cross sectional view depicting a sidewall portion of the processing vessel.
Figure 4:
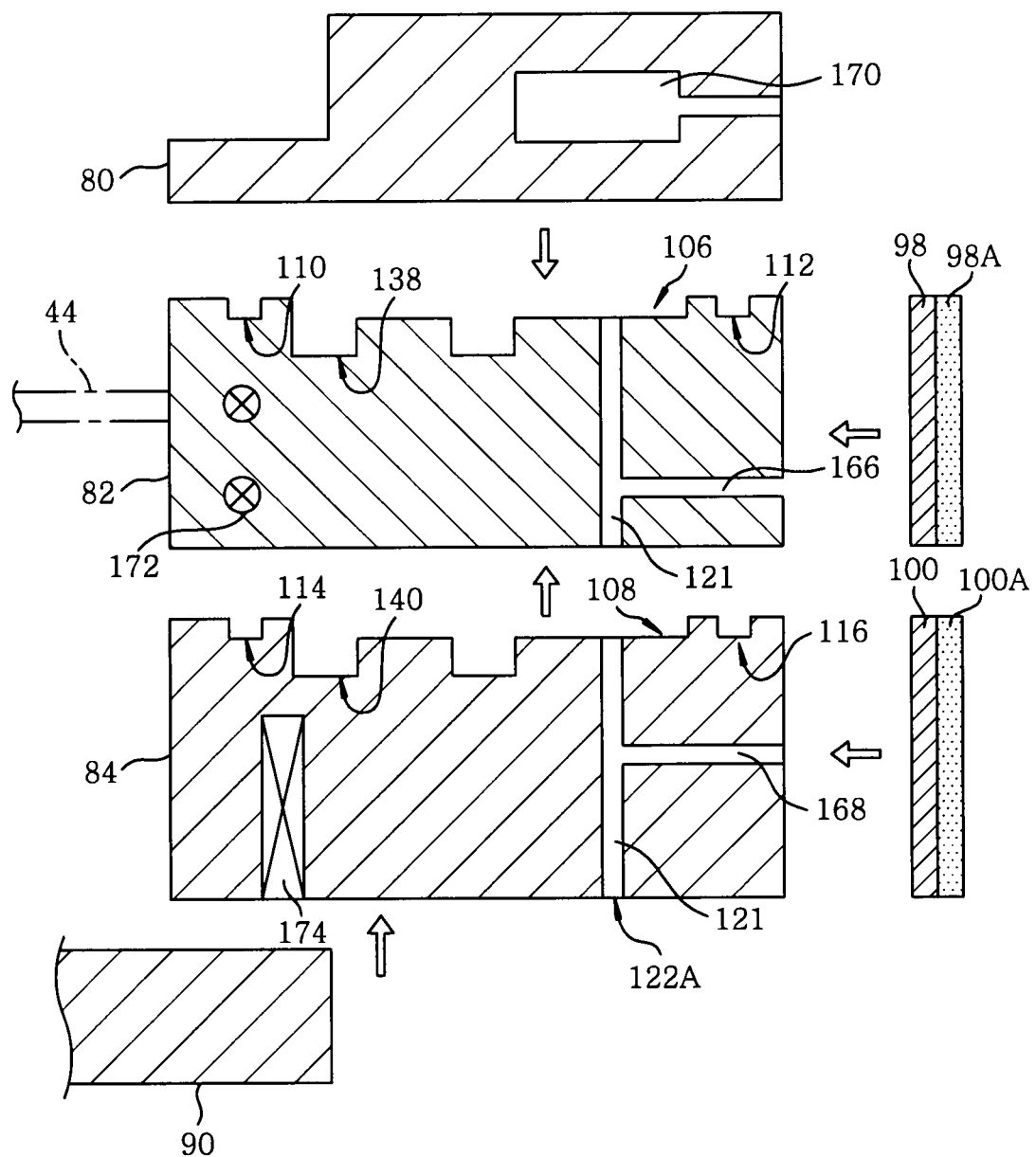
FIG. 4 is an exploded view representing portions of the processing vessel.

As specifically shown in FIGS. 3 and 4, the processing vessel 34 includes a plurality of, e.g., three, ring-shaped metal block bodies 80, 82 and 84. In other words, the processing vessel 34 is divided along horizontal planes into the plurality of block bodies. The block bodies 80, 82 and 84 are placed one atop another. Heat insulating vacuum layers (inter-block heat insulating vacuum layers) 86 and 88 are provided in the boundary portions between the adjoining block bodies.

In the illustrated embodiment, the sidewall of the processing vessel 34 are divided into an upper block body 80 for supporting the ceiling plate 56, a middle block body 82 for supporting the shower head 44 and a lower block body 84 corresponding in height to the mounting table 36. The bottom portion of the lower block body 84 makes direct metal-to-metal contact with the bottom wall 90 of the processing vessel 34 and is combined therewith by means of metal bolts not shown in the drawings. A seal member 92 such as an O-ring or the like is provided between the lower block body 84 and the bottom wall 90. Outer circumferential surfaces of the middle block body 82 and the lower block body 84 are covered with protective cover members 98 and 100 made of metal such as stainless steel or the like. Outer heat insulating vacuum layers 94 and 96 are respectively provided between the middle and lower block bodies 82 and 84 and the protective cover members 98 and 100. Resin-made main cover bodies 98A and 100A are respectively provided on the outer surfaces of the protective cover members 98 and 100 to improve safety against fire or the like.

Referring particularly to FIG. 3, a plurality of non-metallic spacer members 102 and 104 for adjusting gap distances between the adjoining block bodies (inter-block gap distances), i.e., the sizes of the heat insulating vacuum layers, is provided between the adjoining block bodies 80 and 82 and between the adjoining block bodies 82 and 84. The spacer members 102 and 104 have a rectangular parallelepiped or cubic shape and are circumferentially arranged at regular intervals. As can be seen in FIG. 2 showing the top surface of the lower block body 84, four spacers 104 are circumferentially arranged. The number of the spacer members 104 is not limited to that in the illustrated embodiment. The spacer members 102 and 104 are made of a non-metallic material, e.g., polyimide resin having low thermal conductivity, to suppress heat transfer between the block bodies.

The respective block bodies may differ in shape from one another. As illustrated in FIG. 2, the lower block body 84 has a rectangular shape when viewed from the top thereof. The middle block body 82 may be formed into an octagonal shape when seen from the top thereof. In FIGS. 1, 3 and 4, the respective block bodies 80, 82 and 84 are shown as if they have the same cross section, to avoid complexity of the drawings.

In the illustrated embodiment, relatively wide ring-shaped recesses 106 and 108 extending in a circumferential direction of the processing vessel 34 are respectively formed on the top surfaces of the middle block body 82 and the lower block body 84 to define the heat insulating vacuum layers 86 and 88. Ring-shaped seal grooves 110, 112, 114 and 116 are formed on the inner and outer peripheral sides of the recesses 106 and 108. Seal members 110A, 112A, 114A and 116A such as O-rings or the like are respectively placed in the seal grooves 110, 112, 114 and 116. If the block bodies 80, 82 and 84 are combined together, the inner and outer peripheral portions of the recesses 106 and 108 are hermetically sealed by means of the seal members 110A, 112A, 114A and 116A, thus leaving heat insulating gaps 118 and 120. An inter-block gap H1 in the heat insulating gaps 118 and 120 is about 1 mm, but an inter-block gap H2 in the portions other than the heat insulating gaps 118 and 120 is approximately 0.2 mm.

Formed through the middle block body 82 and the lower block body 84 is a gas exhaust line 121 that allows the heat insulating gaps 118 and 120 to communicate each other and has an outlet 122A opened in the bottom surface of the lower block body 84. As shown in FIG. 1, a vacuum exhaust system 124 for the gaps is connected to the outlet 122A of the gas exhaust line 121. The vacuum exhaust system 124 includes a gas exhaust line 126 whose one end is connected to the outlet 122A; and a turbo molecular pump 128, a pressure gauge 130, a pressure control valve 132 and a dry pump 134 sequentially provided on the gas exhaust line 126. The heat insulating gaps 118 and 120 serve as the heat insulating vacuum layers 86 and 88 by vacuum exhausting the heat insulating gaps 118 and 120 down to a specified pressure with the vacuum exhaust system 124. The turbo molecular pump 128 is a pump for use in high vacuum exhaust and may be omitted in case of not requiring a high vacuum level. By increasing the number of the gas exhaust line 121, it is possible to accelerate evacuation between the heat insulating vacuum layers 86 and 88.

Referring back to FIG. 3, ring shaped shielding recesses 138 and 140 extending in the circumferential direction of the processing vessel 34 are formed in inner peripheral sides of the recesses 106 and 108 that define the heat insulating gaps 118 and 120, respectively. Within the shielding recesses 138 and 140, there are provided coil spring type shield members 142 and 144 each of which has a ring shape as a whole. Each of the shield members is inserted between the upper and lower block bodies to make contact with them in a vertically elastically collapsed state, thereby assuring electric connection between the upper and lower block bodies. Accordingly, the microwaves or high frequency waves propagating from the processing space S through the gaps between the block bodies are shielded by the shield members 142 and 144 and prevented from leaking to the outside of the processing vessel 34. In the illustrated embodiment, each of the block bodies 80, 82 and 84 is electrically grounded.

On the inner sides of the inner peripheral side seal members 110A and 114A and in between the adjoining block bodies, there are provided plasma infiltration prevention ring members 150 and 152 made of, e.g., a resin material, and extending in the circumferential direction of the processing vessel 34. This prevents damage of the seal members 110A and 114A which would otherwise occur when the radicals of plasma in the processing space S reach the seal members 110A and 114A.

In the meantime, the outer heat insulating vacuum layers 94 and 96 formed on the outer peripheral sides of the middle and lower block bodies 82 and 84 are formed of outer heat insulating gaps (outer gaps) 162 and 164. The outer heat insulating gaps 162 and 164 are defined by hermetically sealing, with seal members 154, 156, 158 and 160 such as O-rings or the like, the opposite top and bottom end portions of small gaps formed between the outer circumferential surfaces of the respective block bodies 82 and 84 and the respective protective cover members 98 and 100. The outer heat insulating gaps 162 and 164 communicate with the aforementioned gas exhaust line 121 via communication paths 166 and 168. Thus, by operating the vacuum exhaust system 124 connected to the gas exhaust line 121, the outer heat insulating gaps 162 and 164 are also vacuum exhausted, as a result of which the outer heat insulating gaps 162 and 164 serve as the outer heat insulating vacuum layers 94 and 96. Instead of allowing the heat insulating gaps 118, 120 and the outer heat insulating gaps 162, 164 to communicate with each other, the heat insulating gaps 118 and 120 may communicate with each other and the outer heat insulating gaps 162 and 164 may communicate with each other, and the gaps 118, 120 and the gaps 162, 164 may be connected to separate vacuum exhaust systems. This ensures that, by keeping only the heat insulating gaps 118 and 120 at an atmospheric pressure for instance, the temperature of the processing vessel 34 can be rapidly decreased at the time of maintenance and repair.

As illustrated in FIG. 2, the protective cover member 100 is divided into a plurality of, e.g., four, parts at suitable points in the circumferential direction of the processing vessel, thereby making it easy to attach the protective cover member 100. Preferably, the protective cover member 98 of the middle block body 82 is also divided in the same manner.

As shown in FIG. 1, a coolant path 170 for allowing coolant to circulate therethrough is provided in the upper block body 80 as a block body cooling unit. It may be possible to use a chiller as the block body cooling unit. Block body heating units 172 and 174 are respectively provided in the middle block body 82 and the lower block body 84. The block body heating unit 172 of the middle block body 82 may be a resistance sheath heater embedded in the middle block body 82 and extending in the circumferential direction of the processing vessel 34. The block body heating unit 174 of the lower block body 84 may be a plurality of rod shaped cartridge heaters embedded in the lower block body 84. Kinds of the heaters are not limited to the ones noted above.

Figure 5:
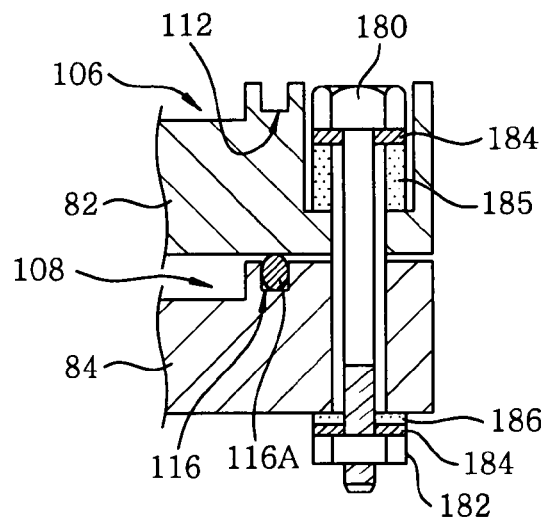
FIG. 5 is a view for explaining how to interconnect block bodies by using metal bolts.

Metal bolts and nuts can be used in interlinking the block bodies 80, 82 and 84. FIG. 5 shows how to combine the middle block body 82 and the lower block body 84. A metal bolt 180 is inserted into a bolt hole and tightened by a nut 182. Ring shaped washers 184 and ring shaped spacers 185 and 186 made of heat resistant resin with low thermal conductivity are respectively interposed between the bolt 180 and its corresponding seat face and between the nut 182 and its corresponding seat face. Heat transfer between the block bodies 82 and 84 is suppressed by the heat insulating action of the spacers 185 and 186. The spacer 185 has a height of about 20 to 30 mm and exhibits a heat insulating action superior to that exercised by the spacer 186. The upper block body 80 and the middle block body 82 can be combined together in the same manner as set forth just above.

Referring back to FIG. 1, for example, thermocouples 188A, 188B and 188C are respectively provided in the block bodies 80, 82 and 84 as a temperature measuring unit. Outputs of the respective thermocouples 188A, 188B and 188C are inputted to a temperature control unit 190 including a microcomputer or the like. Based on the outputs of the respective thermocouples 188A, 188B and 188C (namely, the actual temperature of the respective block bodies) and the target temperatures of the respective block bodies, the temperature control unit 190 independently controls the block body cooling unit 170 and the block body heating unit 172 and 174 noted above.

Next, description will be made on a plasma CVD film forming method performed by using the plasma processing apparatus 32. Describing first on the target (preset) temperatures of the respective block bodies 80, 82 and 84 constituting the processing vessel 34, the preset temperature of the upper block body 80 supporting the ceiling plate 56 is made equal to about 100° C. in order to suppress consumption of the ceiling plate 56 made of alumina. The preset temperature of the middle block body 82 is made equal to about 200° C. with a view to prevent an unnecessary film from depositing on the inner surface of the middle block body 82. The preset temperature of the lower block body 84 is made in a range of 150 to 200° C., e.g., 150° C., in an effort to prevent an unnecessary film from depositing on the inner surface of the lower block body 84. Furthermore, the temperature of the bottom wall 90 of the processing vessel 34 is set substantially equal to the temperature of the lower block body 84. The reason for keeping the temperature of the lower block body 84 lower than that of the middle block body 82 is that the lower block body 84 makes thermal contact with the bottom wall 90 and, therefore, there is a need to adopt a lowest temperature at which no unnecessary film is deposited.

In the process of forming a film, the semiconductor wafer W is first put into the processing vessel 34 through the gate valve 46 (see FIG. 2) by means of a transfer arm (not shown) and then placed on the top mounting surface of the mounting table 36 by moving lifter pins (not shown) up and down. Then, the wafer W is heated and kept at a process temperature by use of the resistance heater 40 of the mounting table 36.

The inside of the processing vessel 34 is maintained at a specified process pressure, e.g., within a range of 0.01 to several Pa. A gas, e.g., a CF-based gas, is supplied at a controlled flow rate into the processing vessel 34 from the shower head 44 of the gas injection portion 42. Concurrently, the microwaves generated in the microwave generator 76 are supplied to the planar antenna member 62 via the waveguide 72 and the coaxial waveguide 68. Then, the microwaves whose wave length is shortened by the wave retardation plate 64 is introduced into the processing space S, whereby plasma is generated within the processing space S and a specified plasma CVD processing is carried out. At this time, plasma begins to generate in a region 200 just below the ceiling plate 56 and is diffused downwards to activate the gas, thereby creating active species. Under the action of the active species, the surface of the wafer W is subjected to a plasma CVD processing. As a result, a fluorocarbon film for instance is formed on the surface of the wafer W. The process temperature at this time is, e.g., about 330° C., which shows the temperature of the wafer W.

Simultaneously with this processing, the vacuum exhaust system 124 for the gaps is driven to vacuum exhaust the inside of the respective heat insulating vacuum layers 86 and 88 and the respective outer heat insulating vacuum layers 94 and 96, while the respective block bodies 80, 82 and 84 are independently controlled to have the temperatures noted above under the control of the temperature control unit 190. Although the ceiling plate 56 is exposed during the processing process to a high temperature due to the radiant heat of the plasma generated in the region 200 just below the ceiling plate 56, the ceiling plate 56 and the upper block body 80 supporting the same are kept at about 100° C. by circulating coolant through the coolant path 170 of the upper block body 80. This helps to suppress consumption of the ceiling plate 56 otherwise caused by the plasma and to reduce generation of particles attributable to consumption of the ceiling plate 56. This also makes it possible to prolong the life span of the ceiling plate 56.

The middle block body 82 is heated and kept at about 200° C. by the block body heating unit 172 provided in the middle block body 82. Furthermore, the lower block body 84 and the bottom wall 90 making metal-to-metal contact therewith are heated and kept at about 150° C. by the block body heating unit 174 provided in the lower block body 84. By maintaining the block bodies 82 and 84 at a relatively high temperature, it is possible to prevent an unnecessary fluorocarbon film from adhering to the inner surfaces thereof. Even if the unnecessary fluorocarbon film has adhered to the inner surfaces of the block bodies 82 and 84, it can be readily removed by dry etching.

Seeing that the adjoining block bodies 80, 82 and 84 do not make direct metal-to-metal contact with one another and there are provided the heat insulating vacuum layers 86 and 88 between the adjoining block bodies, it becomes possible to sharply reduce heat transfer occurring between the respective block bodies. As a result, the temperatures of the respective block bodies can be controlled independently and efficiently. Moreover, since there is no need to provide an inner wall as in the conventional case, the apparatus becomes structurally simple and small in size.

Thanks to the fact that the protective cover members 98 and 100 are provided through the outer heat insulating vacuum layers 94 and 96 on the outer periphery of the middle and lower block bodies 82 and 84 kept at an elevated temperature, it is possible to sharply reduce heat transfer from the block bodies 82 and 84 to the protective cover members 98 and 100, as a result of which the protective cover members 98 and 100 can be kept at a safe temperature without making them structurally complicated. In addition, heating efficiency can be improved by suppressing dissipation of the heat to the outside.

Presence of the plasma infiltration prevention ring members 150 and 152 makes it possible to avoid damage of the seal members 110A and 114A which would otherwise be caused by the radicals of plasma infiltrating from the processing space S into the gaps between the respective block bodies 80, 82 and 84. Furthermore, presence of the shield members 142 and 144 makes it possible to prevent microwaves (and high frequency waves) from infiltrating into the gaps between the respective block bodies 80, 82 and 84 from the processing space S by a skin effect and leaking to the outside.

Dry etching (cleaning) of the unnecessary film adhering to the inner wall surface and the like of the processing vessel 34 is performed by generating plasma while supplying an oxidation gas, e.g., $O_2$ gas, from the shower head 44. In this case, like the plasma CVD processing described earlier, the respective block bodies 80, 82 and 84 are kept, e.g., at the same temperatures as in the plasma CVD processing, by operating the vacuum exhaust system 124 for the gaps and the temperature control unit 190.

Figure 6:
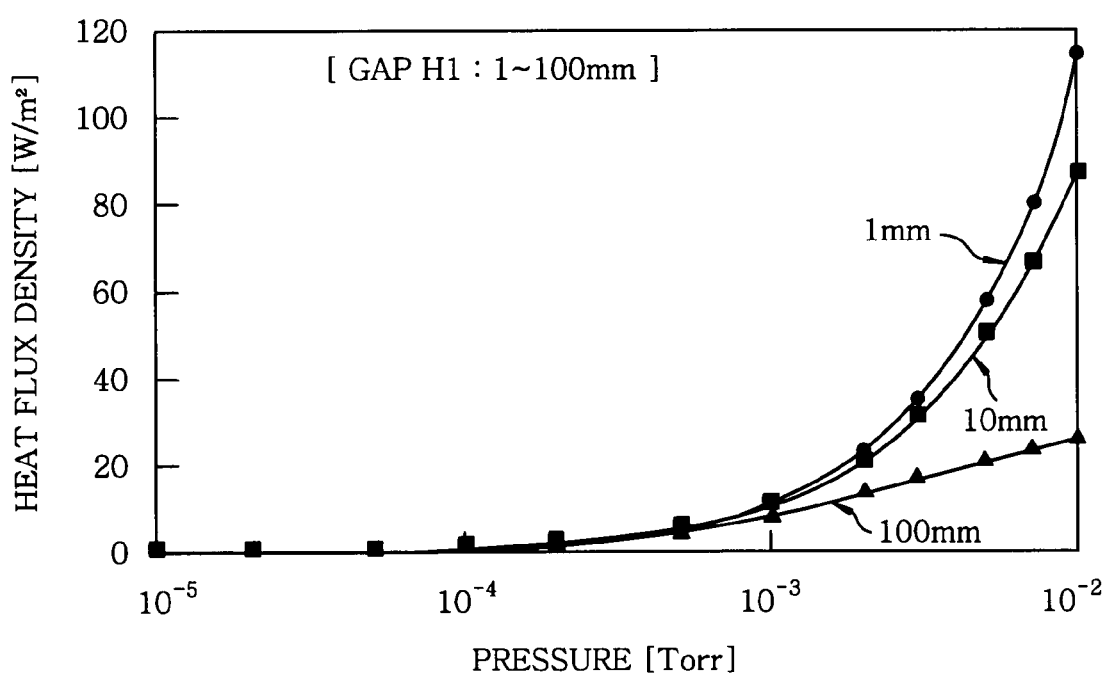
FIG. 6 is a graph representing the influence of pressures and gaps of heat insulating vacuum layers on a heat flow rate.

In this regard, the present inventors have reviewed the optimum value of gap H1 of the respective heat insulating vacuum layers 86 and 88 and the outer heat insulating vacuum layers 94 and 96. The results of review will now be set forth. FIG. 6 is a graph representing the influence of a pressure and the gap H1 of the heat insulating vacuum layers on a heat flux density. In this graph, the gap H1 is changed in a range of 1 to 100 mm. As is apparent from this graph, if the pressure within the heat insulating vacuum layers is set at $10^{-3}$ Torr or less, the heat flux density does not vary with the size of the gap H1 and depends on the pressure. Accordingly, it was confirmed that an increased thermal insulating effect is obtained if the gap H1 is set at about 1 mm and preferably equal to or greater than 1 mm from the view point of size reduction of the apparatus and if the pressure within the heat insulating vacuum layers is set equal to or lower than $10^{-3}$ Torr. Furthermore, under the pressure of $10^{-2}$ to $10^{-3}$ Torr, little difference in the heat flux density has occurred between the gaps of 1 mm and 10 mm. Thus, it was confirmed that it is desirable to use the vacuum exhaust system 124 for the gaps capable of maintaining the pressure at $10^{-2}$ Torr or less and to set the gap H1 at about 1 mm and preferably equal to or greater than 1 mm.

Next, heat transfer amount between two block bodies was compared on a portion-by-portion basis, the results of which will be described with reference to Table 1 noted below. Values for an air heat insulating layer which is not kept in a vacuum state are also described in Table 1 for the purpose of comparison.

TABLE 1

|  | Heat Insulating Vacuum Layer | Air Heat Insulating Layer |
| --- | --- | --- |
| Qvac [W] | 0.1 | — |
| Qatm [W] | 48.1 | 437.4 |
| Qrad [W] | 6.1 | 6.1 |
| Qo-ring [W] | 63.2 | 63.2 |
| Qshield [W] | 31.4 | 31.4 |
| Total [W] | 149 | 538 |

In Table 1, the Qvac refers to a heat transfer amount of the heat flowing through the heat insulating vacuum layers of 1 mTorr, the Qatm being a heat transfer amount of the heat flowing through the air layers of the gaps (on the outer peripheral sides of the outer seal members), the Qrad being a heat transfer amount attributable to radiation, the Qo-ring being a heat transfer amount of the heat flowing through the seal members, the spacer members made of resin and the plasma infiltration prevention ring members made of resin, and the Qshield being a heat transfer amount of the heat flowing through the metallic shield members.

As is apparent in Table 1, it was confirmed that the heat transfer amount is as high as 538 W in case of the heat insulating gaps between the block bodies being filled with the air (in case of the air heat insulating layer), whereas the heat transfer amount is reduced to 149 W in case of the heat insulating vacuum layers of the present invention, thereby achieving reduction of the heat transfer amount to 30% or less. Moreover, since the heat transfer amount Qvac of the heat flowing through the heat insulating vacuum layers is extremely small as compared to the heat transfer amount of other portions, the gap H1 may possibly be set at 1 mm or less.

Furthermore, as can be clearly seen in Table 1, the heat transfer amount Qvac of the heat flowing through the heat insulating vacuum layers is very small in its ratio as compared to the total heat transfer amount. This means that, as set forth earlier with reference to the graph illustrated in FIG. 6, a sufficiently great heat insulating effect can be maintained by setting the pressure within the heat insulating vacuum layers at about $10^{-2}$ Torr. If the target pressure is set at a relatively high pressure as set forth above, there becomes no need to use a high vacuum pressure pump such as a turbo molecular pump or the like.

The present inventors have also reviewed the advantageous effect offered by the outer heat insulating vacuum layers 94 and 96 and have found that the surface side temperature of the protective cover members 98 and 100 is as high as 78° C. in case of the heat insulating layers being filled with the air to bring them into an atmospheric pressure, whereas the surface side temperature of the protective cover members 98 and 100 is decreased to 40° C. in case of the outer heat insulating vacuum layers 94 and 96 being caused to work, thereby achieving reduction of the temperature by as great as 38° C.

(First Modified Embodiment)

Figure 7:
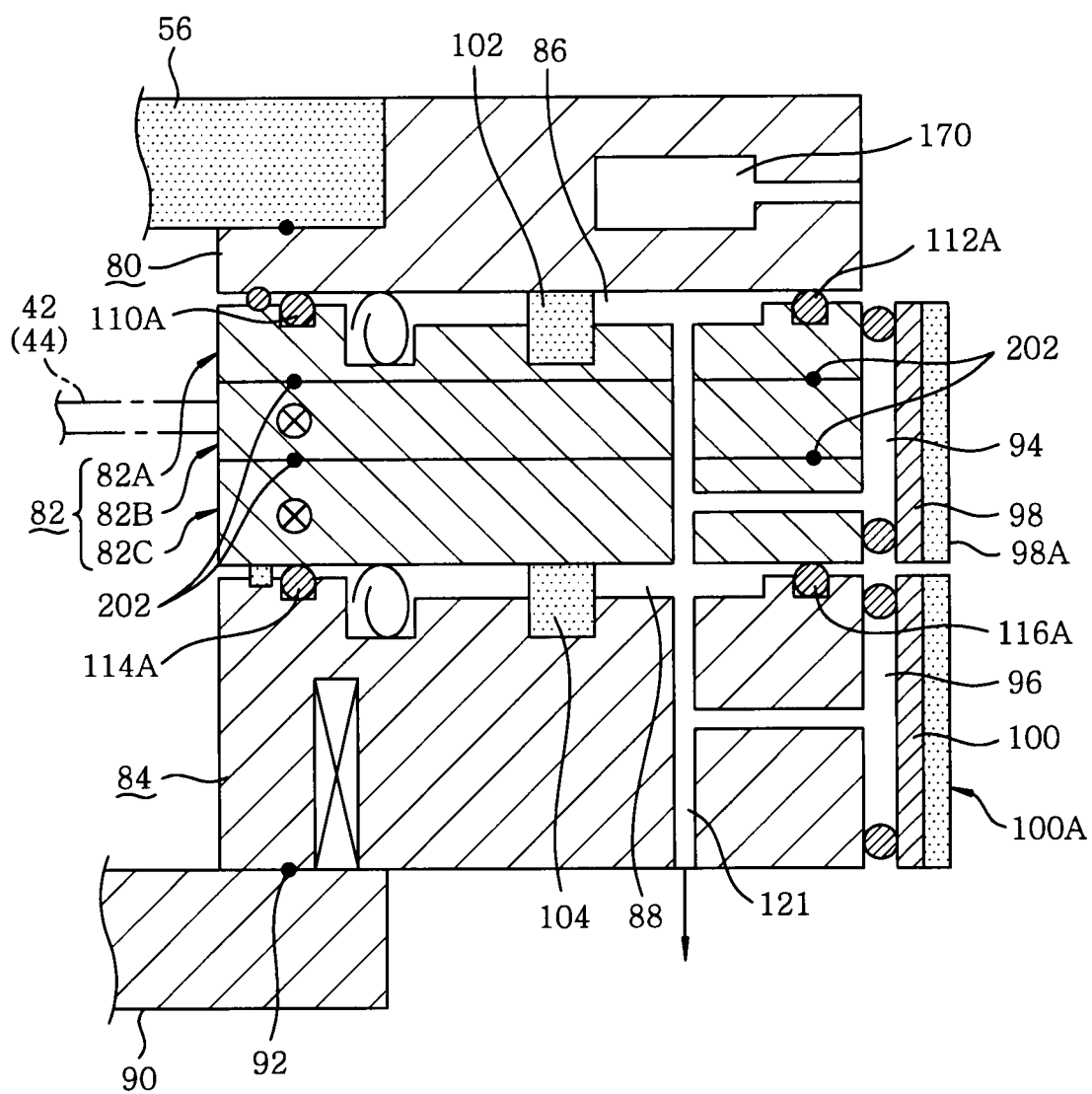
FIG. 7 is a partially enlarged cross sectional view illustrating a first modified embodiment of the processing vessel employed in the present processing apparatus.

Although the middle block body 82 is formed of a single piece in the foregoing embodiment, it may be possible to fabricate the middle block body 82 from a plurality of, e.g., three, mutually layered pieces 82A, 82B and 82C as illustrated in FIG. 7. In this case, seal members 202 such as O-rings or the like are provided between the adjoining pieces 82A, 82B and 82C to seal off the gaps between the pieces. The adjoining pieces 82A, 82B and 82C are brought into metal-to-metal contact with one another to assure good heat transferability between the pieces. Shield members for preventing leakage of the microwaves may be interposed between the adjoining pieces as is the case in the foregoing embodiment. If the middle block body 82 is constructed by combining the plurality of pieces together, it becomes possible to endow each of the pieces with a special function. As an example, a gas ring structure for supplying a cleaning gas may be provided by forming a plurality of gas injection holes along the inner peripheral surface of the top piece 82A (see FIG. 8).

(Second Modified Embodiment)

In the event that the interior of the processing vessel 34 is subjected to, e.g., maintenance and repair in the processing apparatus described above and illustrated in FIGS. 1 to 7, the ceiling plate 56 is separated together with the upper block body 80 provided in the ceiling portion of the processing vessel 34 to thereby open the processing vessel 34 and, then, an operator is allowed to perform a maintenance and repair operation within the processing vessel 34.

However, since the shower head 44 is fixedly secured to the middle block body 82 in this case, it is quite difficult to conduct the maintenance and repair operation. Further, the maintenance and repair operation becomes highly onerous because the shower head 44 needs to be removed depending on the circumstances. Moreover, a cumbersome operation of adjusting the gaps of the heat insulating gaps present between the upper block body 80 and the middle block body 82 needs to be performed when re-assembling the upper block body 80.

In view of this, the second modified embodiment ensures that the part to which the shower head 44 is fixed and the upper block body 80 can be separated from the part lying below the shower head 44, thereby making it possible to rapidly conduct the maintenance and repair operation.

Figure 8:
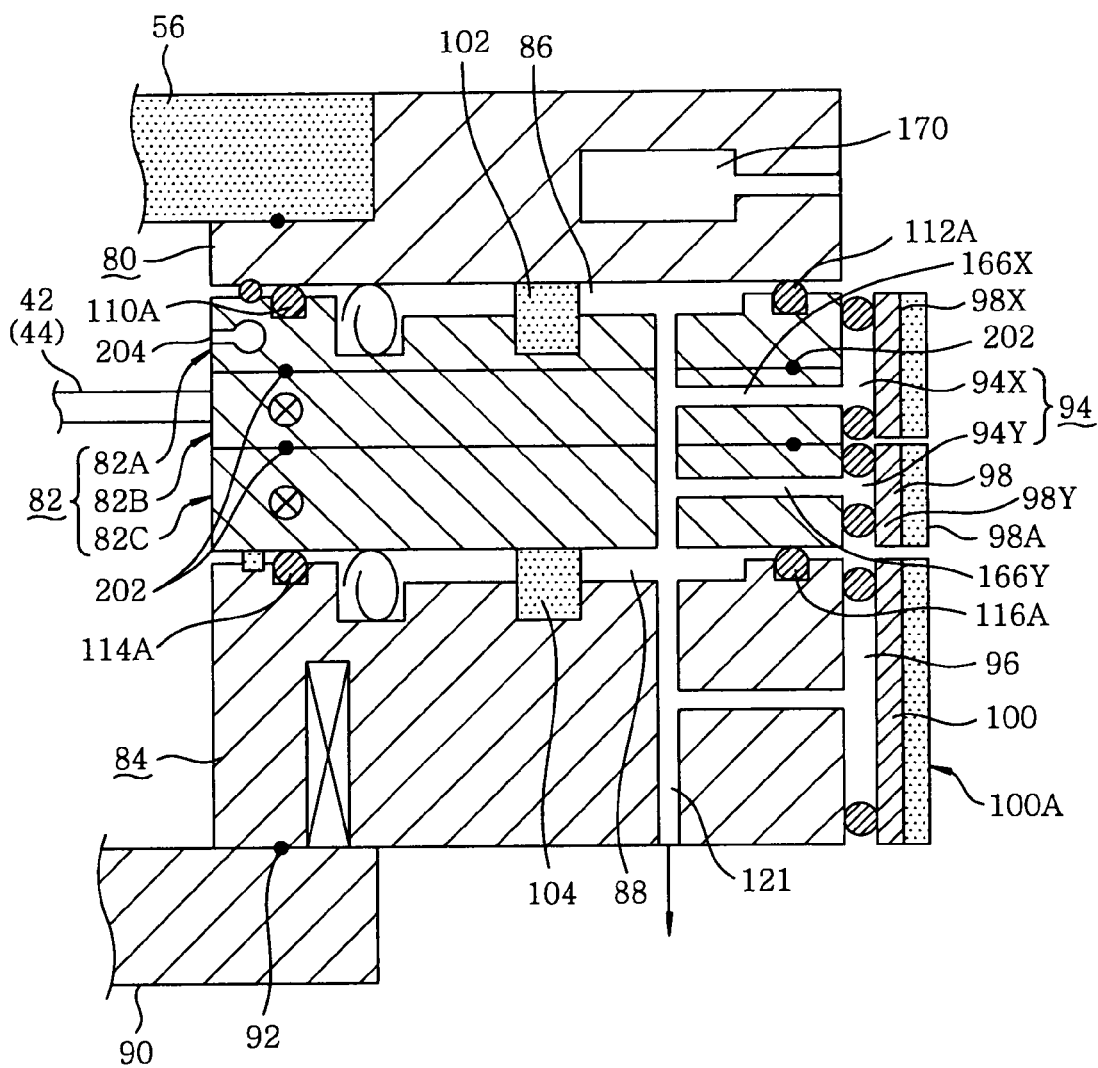
FIG. 8 is a partially enlarged cross sectional view illustrating a second modified embodiment of the processing vessel employed in the present processing apparatus.
Figure 9:
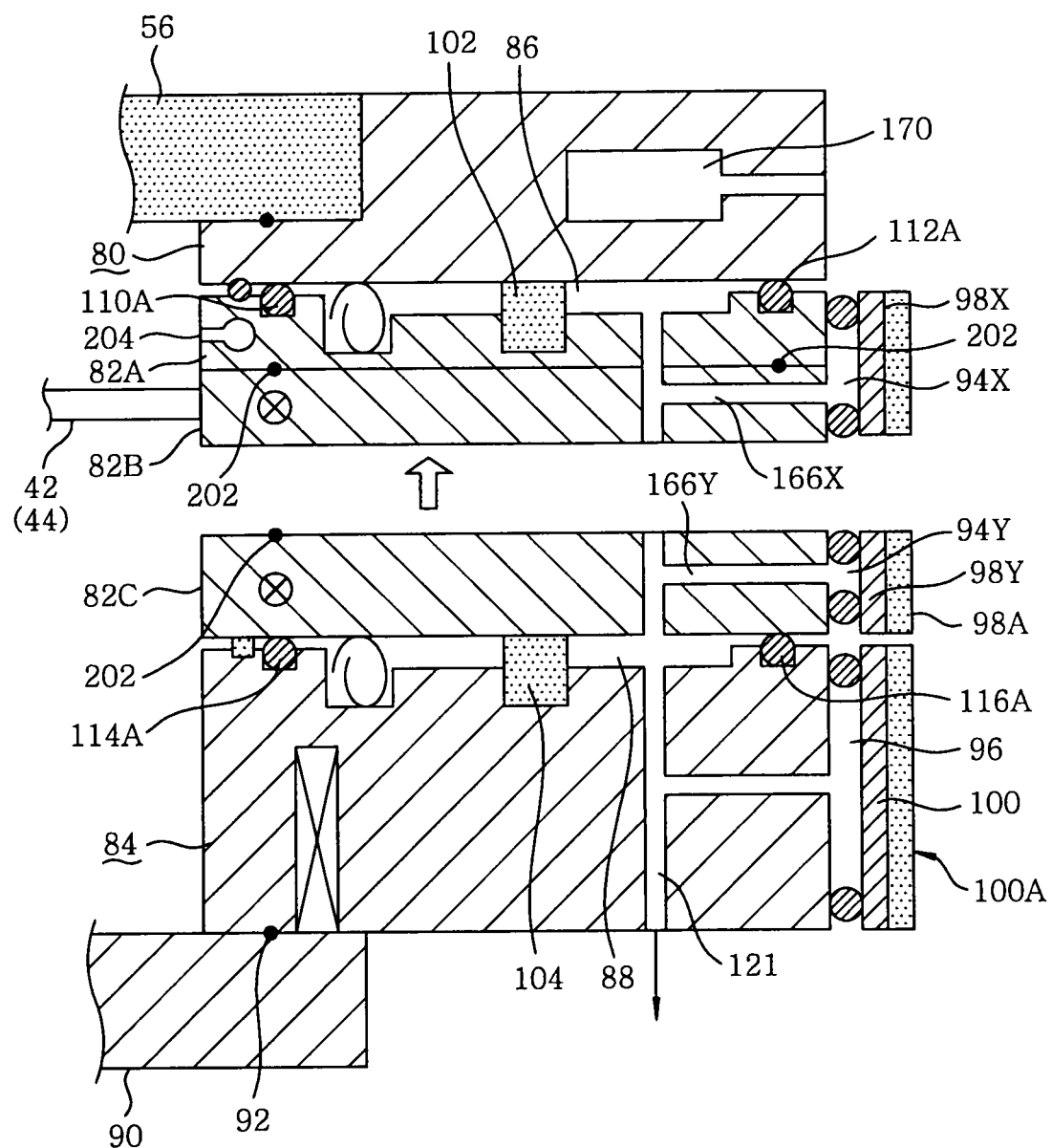
FIG. 9 is a partially enlarged cross sectional view for explaining a position where the processing vessel can be separated apart.
Figure 10:
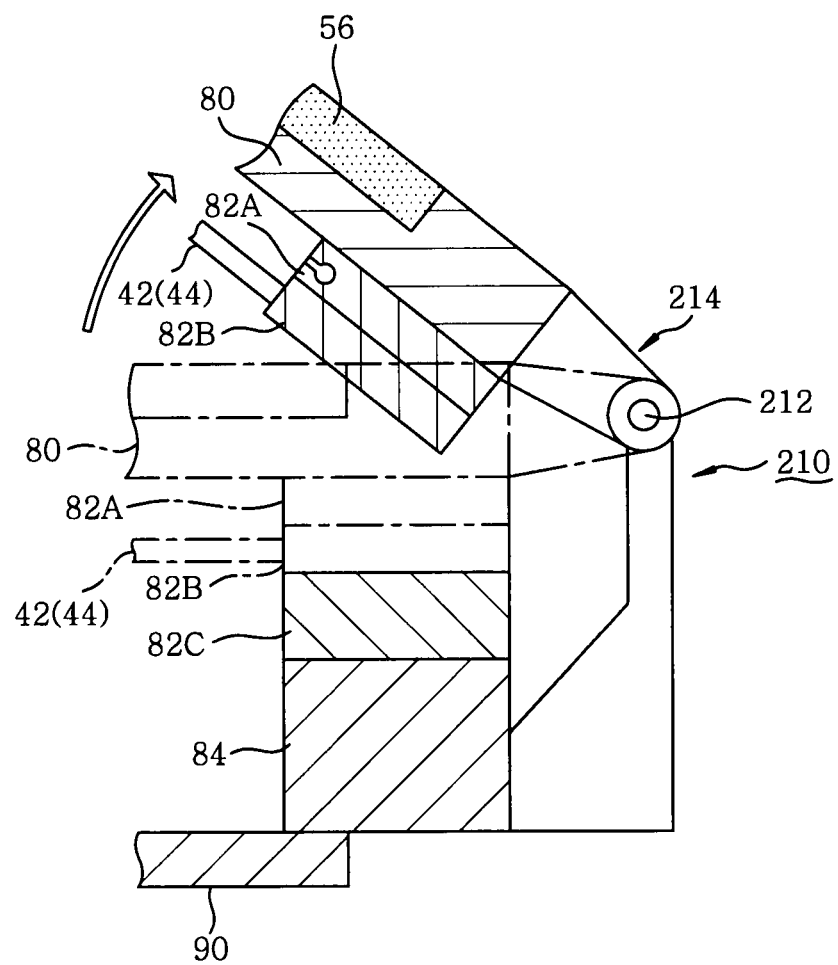
FIG. 10 is a view illustrating a state that an upper block body is unfolded together with pieces of a middle block body combined thereto.
Figure 11:
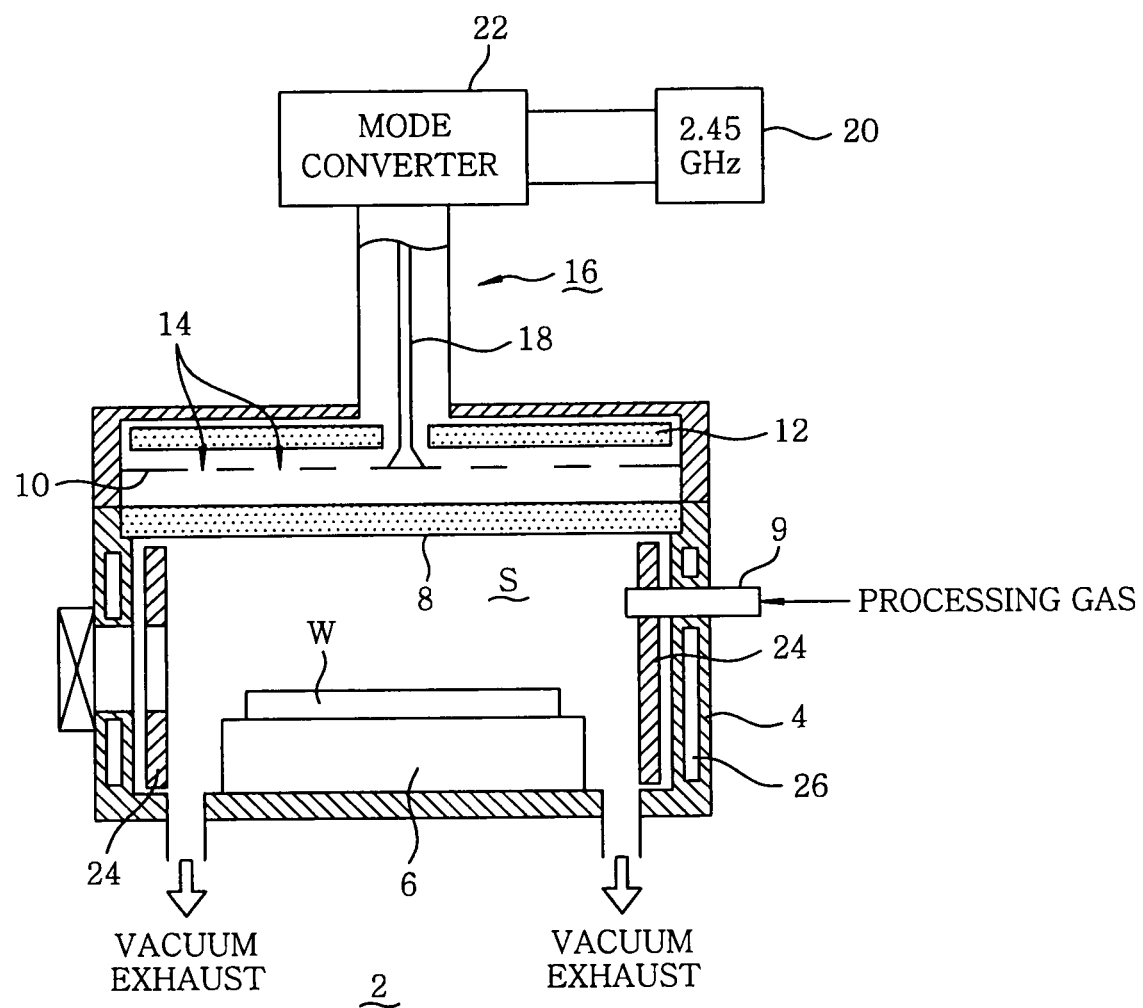
FIG. 11 is a schematic configuration diagram showing a conventional plasma processing apparatus.

Hereinbelow, the second modified embodiment will be described in detail with reference to FIGS. 8 to 10. In FIGS. 8 to 10, the like parts as those illustrated in FIGS. 1 to 7 will be designated by like reference characters and description thereof will be omitted. As already set forth with reference to FIG. 7, the middle block body 82 is divided into a plurality of (three, in the illustrated embodiment) ring-shaped pieces 82A, 82B and 82C. The top piece 82A is provided with a plurality of gas injection holes 204 arranged along the inner peripheral surface thereof and is of a gas ring structure. When necessary, a cleaning gas can be supplied through the gas injection holes 204 into the processing vessel 34.

The intermediate piece 82B is adapted to support the shower head 44. The respective pieces 82A, 82B and 82C are assembled together so that the bottom piece 82C and the intermediate piece 82B lying above the same can be separated from each other if such a need arises, e.g., at the time of maintenance and repair. The upper block body 80 is integrally combined with the top and intermediate pieces 82A and 82B by means of bolts (not shown). FIG. 9 illustrates a state that a unitary body formed of the upper block body 80 and the top and intermediate pieces 82A and 82B is separated from the bottom piece 82C.

Corresponding to the configuration noted above, the outer heat insulating vacuum layer 94 and the protective cover member 98 are respectively divided into upper and lower outer heat insulating vacuum layers 94X, 94Y and upper and lower protective cover members 98X, 98Y in preparation for the separating operation set forth above. Similarly, communication paths 166X and 166Y leading to the gas exhaust line 121 of the vacuum exhaust system 124 for the gaps are formed respectively in a corresponding relationship with the outer heat insulating vacuum layers 94X and 94Y divided into two parts.

As illustrated in FIG. 10, an unfolding mechanism 210 for opening and closing the upper block body 80 is provided on a side portion of the processing vessel 34. The unfolding mechanism 210 has a rotation shaft 212 rotated by an actuator such as an air cylinder or the like. An arm 214 extends from the rotation shaft 212 and has a tip end fixedly secured to the upper block body 80. Accordingly, by operating the unfolding mechanism 210, the unitary body formed of the upper block body 80 and the top and intermediate pieces 82A and 82B is swung and unfolded about the rotation shaft 212 as shown in FIG. 10.

This opens the ceiling side of the processing vessel 34, whereby an operator can rapidly and easily conduct a maintenance and repair operation with no interference of the shower head 44. When the unitary body is swung in the opposite direction and folded into the assembled position, nothing is required but to merely bring the separated intermediate piece 82B into close contact with the bottom piece 82C and there is no need to finely adjust the positional relationship thereof. This makes it easy to perform the folding operation.

Thanks to the fact that the unfolding operation can be performed while the upper block body 80 and the top and intermediate pieces 82A and 82B are kept combined together, there is no need to readjust the heat insulating gap 118. This also allows an operator to quickly perform the maintenance and repair operation. Although the middle block body 82 is divided into three pieces in the illustrated embodiment, the number of pieces divided is not limited thereto. It may be possible to combine the top and intermediate pieces 82A and 82B into a single piece, in which case the middle block body 82 remains divided into two pieces.

The unfolding mechanism 210 may also be applied to the embodiment illustrated in FIGS. 1 and 7. In case the unfolding mechanism 210 is applied to the configuration shown in FIG. 1, the upper block body 80 including the ceiling plate 56 would be unfolded.

The present invention is not limited to the embodiment and the modified embodiments set forth above. For example, the specified temperatures of the respective block bodies 80, 82 and 84 are nothing more than exemplary ones and are not limited thereto.

Depending on the specified temperature of the upper block body 80, it may be possible to provide a heating unit in the upper block body 80. Furthermore, the number of division of the processing vessel 34 (the number of block bodies) is not limited to three.

The processing performed by the plasma processing apparatus is not limited to a fluorocarbon film forming process by plasma CVD but may be, e.g., deposition of other thin films such as a $SiO_2$ film and other plasma processing such as a plasma etching process or a plasma ashing process.

Although microwaves are used to generate plasma in the foregoing embodiments, the present invention is not limited thereto. As an example, it may be possible to employ high frequency waves of 13.5 MHz or magnetron oscillation generated by a DC electric field and a magnetic field by a magnetron. In other words, the plasma generating unit may include a unit for generating a suitable intensity of electric fields, magnetic fields or electromagnetic fields in the processing vessel.

Although the plasma generating unit for generating plasma within the processing vessel 34 is used in the foregoing embodiments, the present invention is not limited thereto. Alternatively, it may be possible to use a plasma introduction unit, like a so-called remote plasma generator, by which plasma is generated outside the processing vessel 34 and then introduced into the processing vessel 34.

The present invention may be applied to a processing apparatus that does not make use of plasma generated by microwaves or high frequency waves. For example, the present invention is applicable to a thermal CVD processing, a quality modification process, an oxidation diffusion process and so forth. In this case, it goes without saying that use of the plasma infiltration prevention ring members 150 and 152 and the shield members 142 and 144 becomes unnecessary.

In addition, the target object is not limited to the semiconductor wafer but may be a LCD substrate, a glass substrate, a ceramics substrate or the like.

What is claimed is:

1. A processing apparatus for performing a specified processing on a target object, comprising:
   an evacuable processing vessel made of metal;
   a mounting table, provided within the processing vessel, including a mounting surface for mounting the target object thereon;
   a heating unit for heating the target object; and
   a gas introduction unit for introducing a processing gas into the processing vessel, wherein a sidewall of the processing vessel comprises a plurality of interconnected block bodies adjoined via a plurality of seal members to form inter-block heat insulating vacuum layers between the adjoining block bodies, wherein the interconnected block bodies include:

an upper block body supporting a ceiling plate of the processing vessel;

a middle block body supporting a gas injection portion that injects the processing gas into the processing vessel, the gas injection portion serving as a part of the gas introduction unit; and a lower block body corresponding in position to the mounting table, wherein the inter-block heat insulating vacuum layers include a first heat insulating vacuum layer between the upper block body and the middle block body and a second heat insulating vacuum layer between the middle block body and the lower block body, wherein the first heat insulating vacuum layer and the second heat insulating vacuum layer communicate with each other through a common gas exhaust line which is formed in the interconnected block bodies and which is connected to a vacuum exhaust system, and wherein the mounting surface is disposed at a location that, in a vertical direction, is between an upper face of the lower block body and a lower face of the lower block body; and the adjoining block bodies are arranged to adjoin to each other in the vertical direction, wherein the inter-block heat insulating vacuum layers are defined by the block bodies adjoining each other in the vertical direction and by seal members, which hermetically seal inner and outer peripheral sides of inter-block gaps provided between the adjoining block bodies.

2. The processing apparatus of claim 1, wherein the vacuum exhaust system exhausts the inter-block gaps to ensure that the inter-block gaps serve as the inter-block heat insulating vacuum layers.

3. The processing apparatus of claim 2, wherein the adjoining block bodies do not make direct contact with each other.

4. The processing apparatus of claim 3, wherein a non-metallic spacer member for forming each of the inter-block gaps between the adjoining block bodies is provided between the adjoining block bodies.

5. The processing apparatus of claim 2, further comprising a plasma generating unit for forming electric fields, magnetic fields or electromagnetic fields in the processing vessel to generate plasma within the processing vessel or a plasma introduction unit for supplying plasma generated outside the processing vessel into the processing vessel, and wherein a plasma infiltration prevention ring member for preventing the plasma in the processing vessel from infiltrating into each of the inter-block gaps is provided on an inner side of the seal member lying on the inner peripheral side of each of the inter-block gaps.

6. The processing apparatus of claim 5, wherein the processing apparatus comprises the plasma generating unit, the plasma generating unit including a unit for supplying microwaves or high frequency waves into the processing vessel, and wherein a shield member for electrically connecting the adjoining block bodies to prevent the microwaves or the high frequency waves from leaking to the outside of the processing vessel is provided in each of the inter-block gaps.

7. The processing apparatus of claim 5, wherein the processing apparatus comprises the plasma generating unit, the plasma generating unit including a unit for supplying microwaves into the processing vessel, and wherein a planar antenna member for introducing the microwaves into the processing vessel is provided in the ceiling plate.

8. The processing apparatus of claim 1, wherein at least one of the block bodies has an outer circumferential surface covered with a protective cover member and wherein an outer heat insulating vacuum layer is provided between the outer circumferential surface and the protective cover member.

9. The processing apparatus of claim 8, wherein the outer heat insulating vacuum layer is defined by said at least one of the block bodies, the protective cover member and seal members for hermetically sealing end portions of an outer gap provided between said at least one of the block bodies and the protective cover member, and wherein the vacuum exhaust system exhausts the outer gap to ensure that the outer gap serves as the outer heat insulating vacuum layer.

10. The processing apparatus of claim 9, wherein the inter-block heat insulating vacuum layers and the outer heat insulating vacuum layer communicate with each other through a communication path and are vacuum exhausted by the vacuum exhaust system.

11. The processing apparatus of claim 1, wherein at least one of the block bodies is provided with a block body heating unit.

12. The processing apparatus of claim 1, wherein at least one of the block bodies is provided with a block body cooling unit.

13. The processing apparatus of claim 1, wherein each of the block bodies is provided with a block body heating unit for heating the corresponding block body or a block body cooling unit for cooling the corresponding block body, wherein each of the block bodies is provided with a temperature measuring unit for detecting a temperature of the corresponding block body, and wherein the block body heating unit or the block body cooling unit provided in each of the block bodies is connected to a temperature control unit and, based on the temperature of each of the block bodies measured by the temperature measuring unit, the temperature control unit controls the block body heating unit or the block body cooling unit provided in each of the block bodies so that the temperature of each of the block bodies can become a target value.

14. The processing apparatus of claim 13, wherein the block bodies are controlled to have different temperatures.

15. The processing apparatus of claim 1, wherein each of the block bodies is provided with a block body heating unit for heating the corresponding block body or a block body cooling unit for cooling the corresponding block body, and wherein the block body heating unit or the block body cooling unit provided in each of the block bodies is connected to a temperature control unit and, the temperature control unit controls temperatures of the block bodies such that a temperature of the middle block body is higher than a temperature of the lower block body and the temperature of the lower block body is higher than a temperature of the upper block body.

16. The processing apparatus of claim 1, wherein the middle block body comprises a plurality of vertically layered pieces, and wherein one of the pieces other than a lowermost piece is adapted to support the gas injection portion.

17. The processing apparatus of claim 16, wherein the plurality of pieces is layered to ensure that the vertically adjoining pieces make direct contact with each other, wherein the upper block body and the piece for supporting the gas injection portion are kept combined together, wherein the piece for supporting the gas injection portion is separable from the piece below it, and wherein the processing apparatus comprises an unfolding unit for allowing the upper block body and the piece for supporting the gas injection portion to be unfolded as a unit.

18. The processing apparatus of claim 16, wherein the middle block body comprises three pieces, wherein a gas ring structure for supplying a cleaning gas is provided in a top one of the three pieces, wherein the gas injection portion is supported on a middle one of the three pieces, wherein the upper block body is integrally combined with the top and middle pieces, wherein a bottom one of the three pieces is separable from the middle piece, and wherein the processing apparatus comprises an unfolding unit for allowing the upper block body and the top and middle pieces to be unfolded as a unit, and the upper block body and the top and middle pieces combined together are separated from the bottom piece by operating the unfolding unit.

19. A processing apparatus for performing a specified processing on a target object, comprising:

an evacuable processing vessel made of metal;

a mounting table, provided within the processing vessel, for mounting the target object thereon;

a heating unit for heating the target object; and a gas introduction unit for introducing a processing gas into the processing vessel, wherein a sidewall of the processing vessel comprises a plurality of interconnected block bodies adjoined to each other in a vertical direction via a plurality of seal members to form inter-block heat insulating vacuum layers between the adjoining block bodies, wherein the interconnected block bodies include a first block body, a second block body, and a third block body, wherein at least one first spacer is disposed between the first block body and the second block body and between the plurality of seal members, the at least one first spacer forming a first inter-block gap such that the first block body is not in direct contact with the second block body and wherein at least one second spacer is disposed between the second block body and the third block body and between the plurality of seal members, the at least one second spacer forming a second inter-block gap such that the second block body is not in direct contact with the third block body, wherein the first and second inter-block gaps form part of the inter-block heat insulating vacuum layers formed between the adjoining block bodies, wherein the first inter-block gap and the second inter-block gap communicate with each other through a common gas exhaust line which is formed in the interconnected block bodies and which is connected to a vacuum exhaust system, and wherein the at least one first spacer and the at least one second spacer are separate from the seal members.

20. The processing apparatus of claim 19, wherein the at least one first spacer and the at least one second spacer are non-metallic.

* * * * *

UNITED STATES PATENT AND TRADEMARK OFFICE
CERTIFICATE OF CORRECTION

PATENT NO.        : 8,485,127 B2                                     Page 1 of 1
APPLICATION NO. : 12/090493
DATED             : July 16, 2013
INVENTOR(S)       : Nishimoto et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1016 days.

Signed and Sealed this
Eighth Day of September, 2015

Michelle K. Lee
*Director of the United States Patent and Trademark Office*